(12) United States Patent
O'Brien

(10) Patent No.: US 6,504,498 B1
(45) Date of Patent: Jan. 7, 2003

(54) METHOD AND APPARATUS FOR OFFSET CANCELLATION IN A WIRELESS RECEIVER

(75) Inventor: Jeremiah Christopher O'Brien, Ballydehob (IR)

(73) Assignee: Parthus Ireland Limited, Dublin (IE)

( * ) Notice: Subject to any disclaimer, the term of this patent is extended or adjusted under 35 U.S.C. 154(b) by 0 days.

(21) Appl. No.: 09/671,962

(22) Filed: Sep. 27, 2000

Related U.S. Application Data

(60) Provisional application No. 60/156,228, filed on Sep. 27, 1999.

(51) Int. Cl.[7] .......................... H03M 1/06; H03M 3/00; H03L 7/00
(52) U.S. Cl. .......................... 341/143; 341/118; 331/17
(58) Field of Search ................................ 341/143, 144, 341/61, 118.12; 342/352; 455/182, 131, 313; 375/344, 376; 327/105; 331/16, 17, 1 A; 377/48; 332/100

(56) References Cited

U.S. PATENT DOCUMENTS

| | | | |
|---|---|---|---|
| 4,181,886 A | * | 1/1980 | Cooperman .................. 342/352 |
| 4,232,398 A | | 11/1980 | Gould et al. |
| 4,234,964 A | | 11/1980 | Cieslak et al. |
| 4,599,732 A | | 7/1986 | LeFever |
| 4,766,417 A | | 8/1988 | Takayama et al. |
| 4,932,072 A | | 6/1990 | Toko |
| 5,055,802 A | * | 10/1991 | Hietala et al. .................. 331/16 |
| 5,262,686 A | | 11/1993 | Kurosawa |
| 5,298,901 A | | 3/1994 | Lekmine et al. |
| 5,412,687 A | | 5/1995 | Sutton et al. |
| 5,523,756 A | | 6/1996 | Mariuz et al. |
| 5,557,233 A | | 9/1996 | Sobel |
| 5,574,998 A | | 11/1996 | Andoh |
| 5,603,109 A | | 2/1997 | Feeney |
| 5,661,480 A | | 8/1997 | Vallancourt |
| 5,715,281 A | | 2/1998 | Bly et al. |
| 5,715,518 A | | 2/1998 | Barrere et al. |
| 5,727,030 A | | 3/1998 | Miyashita |
| 5,781,851 A | * | 7/1998 | Saito ........................ 455/182.1 |
| 5,834,987 A | | 11/1998 | Dent |
| 5,910,752 A | | 6/1999 | Filipovic et al. |
| 5,933,458 A | | 8/1999 | Leurent et al. |
| 5,945,889 A | | 8/1999 | Shanthi-Pavan et al. |
| 5,946,344 A | | 8/1999 | Warren et al. |
| 5,982,315 A | * | 11/1999 | Bazarjani et al. ............ 341/143 |
| 6,008,703 A | * | 12/1999 | Perrott et al. ................ 332/100 |
| 6,044,124 A | * | 3/2000 | Monahan et al. ............ 375/376 |
| 6,047,029 A | | 4/2000 | Eriksson et al. |
| 6,052,419 A | | 4/2000 | Hioki |
| 6,088,581 A | | 7/2000 | Bickley et al. |
| 6,208,211 B1 | * | 3/2001 | Zipper et al. .................. 331/17 |
| 6,208,695 B1 | | 3/2001 | Klank et al. |
| 6,392,493 B1 | * | 5/2002 | Minnis ........................ 331/1 A |

OTHER PUBLICATIONS

PCT Search Report, PCT/US00/26585, Sep. 27, 2000.

IEEE Transactions on Instrumentation and Measurement, vol. 40, No. 3, Jun. 1991, "A Multiple Modulator Fractional Divider", Brian Miller and Robert J. Conley.

IEEE Journal of Solid–State Circuits, vol. SC–22, No. 6, Dec. 1987, "A 16–Bit Oversampling A–to–D Conversion Technology Using Triple–Integration Noise Shaping", Y. Matsuya, K. Uchimura, A. Iwata, T. Kobayashi, M. Ishikawa and T. Yoshitome.

(List continued on next page.)

Primary Examiner—Patrick Wamsley
(74) Attorney, Agent, or Firm—Blakely, Sokoloff, Taylor & Zafman LLP

(57) ABSTRACT

An apparatus that has a feedback circuit that couples a wireless receive channel to a frequency synthesizer. A method that reduces an offset in a baseband signal by changing a downconversion frequency in response to the offset.

59 Claims, 8 Drawing Sheets

OTHER PUBLICATIONS

1989 IEEE International Symposium on Circuits and Systems; vol. 1 of 3, Portland Hilton, Portland, OR, May 8–11, 1989, "A High–Resolution CMOS Sigma–Delta A/D Converter with 320 KHZ Output Rate", M. Rebeschini, N. vanBavel, P. Rakers, R. Greene, J. Caldwell, J. Haug.

IEEE Transactions on Communications, vol. COM–33, No. 3, Mar. 1985, "A Use of Double Integration in Sigma Delta Modulation", James C. Candy.

IEEE Journal of Solid–State Circuits, vol. SC–21, No. 6, Dec. 1986, "A 12–bit Sigma–Delta Analog–to–Digital Converter with a 15–MHz Clock Rate", R. Koch, B. Heise, F. Eckbauer, E. Engelhardt, J. Fisher and F. Parzefall.

1988 IEEE International Symposium on Circuits and Systems, Proceedings, vol. 3 of 3, Helsinki Univ. of Technology, Espoo, Finland, Jun. 7–9, 1988, "Quantization Error Spectrum of Sigma–Delta Modulators", B. Boser and B Wooley.

IEEE Journal of Solid–State Circuits, vol. 30, No. 12, Dec. 1995, "Direct–Conversion Radio Transceivers for Digital Communications", Asad A. Abidi.

IEEE Transactions on Communications, vol. COM–29, No. 7, Jul. 1981, "GMSK Modulation for Digital Mobile Radio Telephony", Kazuaki Murota and Kenkichi Hirade.

IEEE Journal of Solid–State Circuits, vol. 32, No. 12, Dec. 1997, "A 27–mW CMOS Fractional–N Synthesizer Using Digital Compensation for 2.5–Mb/s GFSK Modulation", M. Perrott, T. Tewksbury III, and C. Sodini.

IEEE Journal of Solid–State Circuits, vol. 34, No. 5, May 1999, "A 900–MHz/1.8–GHz CMOS Transmitter for Dual–Band Applications", Behzad Razavi.

1996 IEEE, "A Low–Power Baseband Receiver IC for Frequency–Hopped Spread Spectrum Communications", Huan–Chang Liu, Jonathan S. Min, and Henry Samueli.

1998 IEEE, "A 2–V, 2–GHz Low–Power Direct Digital Frequency Synthesizer Chip–Set for Wireless Communication", A. Yamagishi, M. Ishikawa, T. Tsukahara, S. Date.

1993 IEEE International Solid–State Circuits Conference, ISSCC 93/Session 9/Radio Communication Circuits/Paper TP 9.4, "TP 9.4: A 2.5GHz BiCMOS Image–Reject Front–End", Mark D. McDonald.

IEEE Journal of Solid–State Circuits, vol. 31, No. 12, Dec. 1996, "A Direct–Conversion Receiver for 900 MHz (ISM Band) Spread–Spectrum Digital Cordless Telephone", C. Hull, J. Tham, and R. Chu.

\* cited by examiner

| | $SDO_{AVE}$ | $N_{AVE}$<br>$= N + SDO_{AVE}$<br>for $N=92$ | $f_{VCO}$<br>$= f_{osc} \times N_{AVE}$<br>for $f_{osc} =$<br>13.000 MHZ | $f_{DOWN}$<br>$= f_{VCO} \times$ factor<br>for factor $= 2$ | $f_{carrier}$<br>$= f_{DOWN} + f_{IF}$<br>for $f_{IF} = 3 MHZ$ |
|---|---|---|---|---|---|
| CHANNEL 1 | 0.26923 | 92.26923 | 1.1995 GHZ | 2.399 GHZ | 2.402 GHZ |
| CHANNEL 2 | 0.30769 | 92.30769 | 1.2000 GHZ | 2.400 GHZ | 2.403 GHZ |
| CHANNEL 3 | 0.34615 | 92.34615 | 1.2005 GHZ | 2.401 GHZ | 2.404 GHZ |
| CHANNEL 4 | 0.38462 | 92.38462 | 1.2010 GHZ | 2.402 GHZ | 2.405 GHZ |
| •••• | | ••• | ••• | ••• | ••• |
| CHANNEL 12 | 0.69231 | 92.69231 | 1.2050 GHZ | 2.410 GHZ | 2.413 GHZ |
| CHANNEL 13 | 0.73077 | 92.73077 | 1.2055 GHZ | 2.411 GHZ | 2.414 GHZ |
| CHANNEL 14 | 0.76923 | 92.76923 | 1.2060 GHZ | 2.412 GHZ | 2.415 GHZ |
| CHANNEL 15 | 0.80769 | 92.80769 | 1.2065 GHZ | 2.413 GHZ | 2.416 GHZ |
| CHANNEL 16 | 0.84615 | 92.84615 | 1.2070 GHZ | 2.414 GHZ | 2.417 GHZ |
| •••• | | | ••• | ••• | ••• |
| CHANNEL 19 | 0.96154 | 92.96154 | 1.2085 | 2.417 GHZ | 2.420 GHZ |
| CHANNEL 20 | +1.00000 | 93.00000 | 1.2090 | 2.418 GHZ | 2.421 GHZ |

Fig. 4

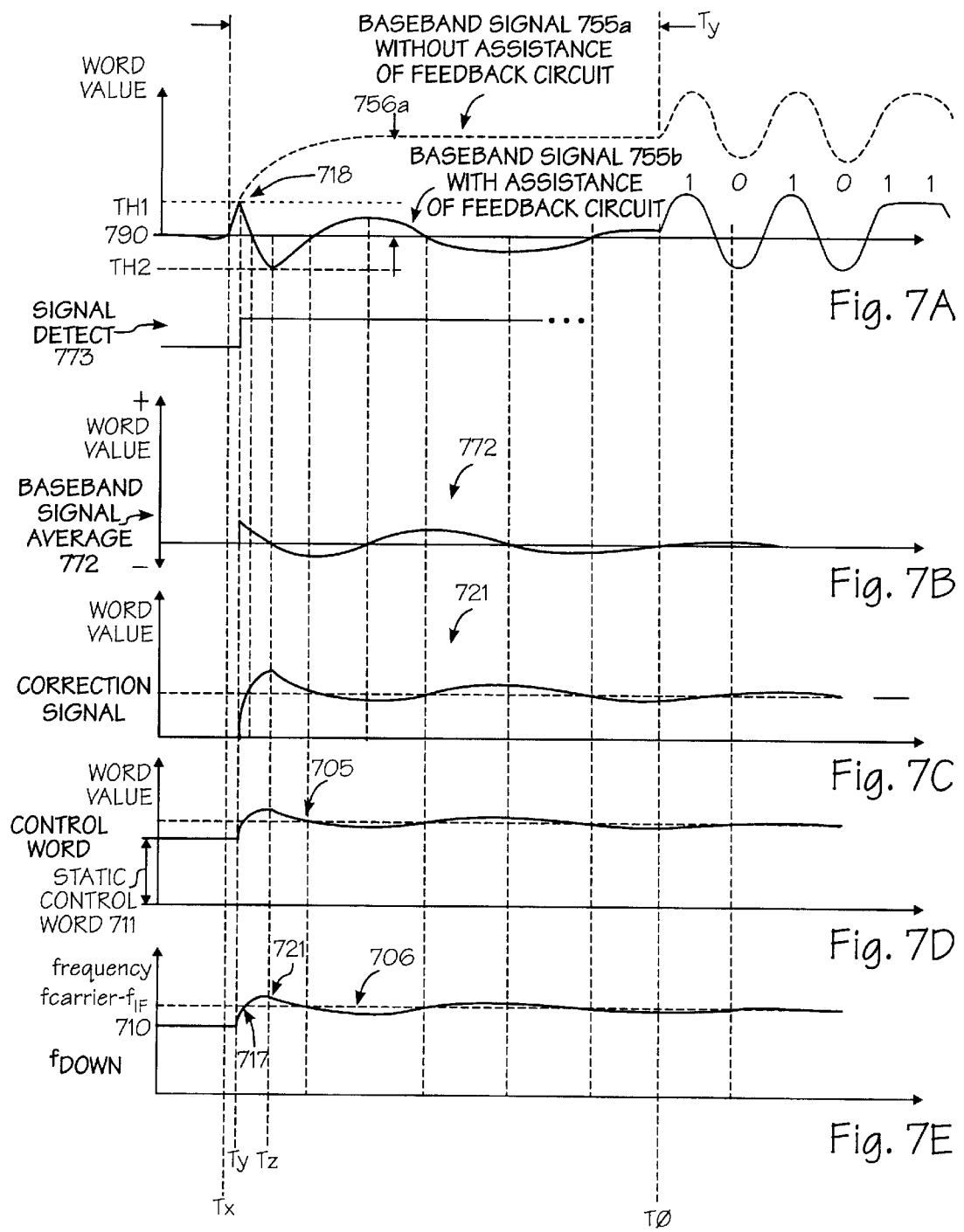

METHOD AND APPARATUS FOR OFFSET CANCELLATION IN A WIRELESS RECEIVER

The present application hereby claims the benefit of the filing date of a related Provisional application filed on Sep. 27, 1999, and assigned Application Serial No. 60/156,228.

FIELD OF INVENTION

The field of invention relates to wireless communication generally; and more specifically, to canceling an offset in a received signal.

BACKGROUND

Super Heterodyne and Frequency Shift Keyed (FSK) Modulation/Demodulation

FIG. 1 shows a portion 106 of a receiving device 166 referred to as a demodulator. A demodulator 106 provides a signal (commonly referred to as a baseband signal b(t) in various applications) that is representative of the information being sent from a transmitting device 165 to a receiving device 166. The demodulator 106 extracts (i.e., demodulates) the baseband signal b(t) from a high frequency wireless signal that "carries" the baseband signal b(t) through the medium (e.g., airspace) separating the transmitting and receiving devices 165, 166.

The particular demodulator 106 example of FIG. 1 is designed according to: 1) a demodulation approach that is commonly referred to as super heterodyne detection (hereinafter referred to as a heterodyne detection for simplicity); and 3) a modulation/demodulation scheme referred to as Frequency Shift Keying (FSK). The industry standard referred to as "BLUETOOTH" (the requirements of which may be found in "Specification of the Bluetooth System", Core v.1.0B, Dec. 1, 1999, and published by the Bluetooth Special Interest Group (SIG)) can apply to both of these approaches and, accordingly, will be used below as a basis for reviewing the following background material.

Heterodyne detection is normally used when dedicated channels are allocated within a range of frequencies 111 (where a range of frequencies may also be referred to as a "band" 111). For BLUETOOTH applications within the United States, 89 channels $110_1$, $110_2$, $110_3$, . . . $110_{79}$ are carried within a 2.400 GHz to 2.482 GHz band 111. Each of the 79 channels are approximately 1 Mhz wide and are centered at frequencies 1 Mhz apart.

The first channel $110_1$ is centered at 2.402 Ghz, the second channel $110_2$ is centered at 2.403 Ghz, the third channel $110_3$ is centered at 2.404 Ghz, etc., and the seventy ninth channel $110_{79}$ is centered at 2.480 Ghz. The heterodyne demodulator 106 accurately receives a single channel while providing good suppression of the other channels present within the band 111. For example, if channel $110_2$ is the channel to be received, the baseband signal b(t) within channel $110_2$ will be presented while the baseband signals carried by channels $110_1$, and $110_3$ through $110_{79}$ will be suppressed.

An FSK modulation/demodulation approach is commonly used to transmit digital data over a wireless system. An example of an FSK modulation approach is shown in FIG. 1. A transmitting modulator 105 within a transmitting device 165 modulates a baseband signal at a carrier frequency $f_{carrier}$ into an antennae 102. That is (referring to the frequency domain representation 150 of the signal launched into the antennae 102) if the baseband signal corresponds to a first logic value (e.g., "1"), the signal 150 has a frequency of $f_{carrier}$+fo. If the data to be transmitted corresponds to a second logic value (e.g., "0"), the signal has a frequency of $f_{carrier}$−fo.

Thus, the signal launched into the antennae 102 alternates between frequencies of $f_{carrier}$+fo and $f_{carrier}$−fo depending on the value of the data being transmitted. Note that in actual practice the transmitted signal 150 may have a profile 151 that is distributed over a range of frequencies in order to prevent large, instantaneous changes in frequency. The carrier frequency $f_{carrier}$ corresponds to the particular wireless channel that the digital information is being transmitted within. For example, within the BLUETOOTH wireless system, $f_{carrier}$ corresponds to 2.402 Ghz for the first channel $110_1$. The difference between the carrier frequency and the frequency used to represent a logical value is referred to as the deviation frequency fo.

Referring now to the heterodyne demodulator 106, note that the signal received by antennae 103, may contain not only every channel within the frequency band of interest 111, but also extraneous signals (e.g., AM and FM radio stations, TV stations, etc.) outside the frequency band 111. The extraneous signals are filtered by filter 113 such that only the frequency band of interest 111 is passed. The filter 113 output signal is then amplified by an amplifier 114.

The amplified signal is directed to a first mixer 116 and a second mixer 117. A pair of downconversion signals d1(t), d2(t) that are 90° out of phase with respect to each other are generated. A first downconversion signal d1(t) is directed to the first mixer 116 and a second downconversion signal d2(t) is directed to the second mixer 117. Each mixer multiples its pair of input signals to produce a mixer output signal. Note that the transmitting modulator 105 may also have dual out of phase signals that are not shown in FIG. 1 for simplicity. Transmitting a pair of signals that are 90° out of phase with respect to one another conserves airborne frequency space by a technique referred to in the art as single sideband transmission.

The frequency $f_{down}$ of both downconversion signals d1(t), d2(t) is designed to be $f_{carrier}$−$f_{IF}$. The difference between the downconversion frequency $f_{down}$ and the carrier frequency $f_{carrier}$ is referred to as the intermediate frequency $f_{IF}$. Because it is easier to design filters 118a,b and 127a,b that operate around the intermediate frequency, designing the downconversion that occurs at mixers 116, 117 to have an output term at the intermediate frequency $f_{IF}$ enhances channel isolation.

The mixer 117 output signal may be approximately expressed as $$kb_{FSK}(t)\cos(2\pi f_{carrier}t)\cos(2\pi f_{down}t). \qquad \text{Eqn. 1}$$

Note that Equation 1 is equal to $$kb_{FSK}(t)[\cos(2\pi(f_{carrier}-f_{down})t)+\cos(2\pi(f_{carrier}+f_{down})t)] \qquad \text{Eqn. 2}$$

which is also equal to $$kb_{FSK}(t)\cos(2\pi f_{IF}t)+kb_{FSK}(t)\cos(2\pi(f_{carrier}+f_{down})t) \qquad \text{Eqn. 3}$$

using known mathematical relationships. The $b_{FSK}(t)$ term represents a frequency shift keyed form of the baseband signal (e.g., a signal that alternates in frequency between +fo for a logical "1" and −fo for a logical "0"). The constant k is related to the signal strength of the received signal and the amplification of amplifier 114. For approximately equal transmission powers, signals received from a nearby transmitting device are apt to have a large k value while signals received from a distant transmitting device are apt to have a small k value.

Equation 3 may be viewed as having two terms: a lower frequency term expressed by $kb_{FSK}(t)\cos(2\pi f_{IF} t)$ and a higher frequency term expressed by $kb_{FSK}(t)\cos(2\pi(f_{carrier}+f_{down})t)$ Filter 118b filters away the high frequency term leaving the lower frequency term $kb_{FSK}(t)\cos(2\pi f_{IF} t)$ to be presented at input 119 of amplification stage 125. Note that, in an analogous fashion, a signal $kb_{FSK}(t)\sin(2\pi f_{IF} t)$ is presented at the input 126 of amplification stage 170.

Amplification stage 125 has sufficient amplification to clip the mixer 117 output signal. Filter 127b filters away higher frequency harmonics from the clipping performed by amplification stage 125. Thus, amplification stage 125 and filter 127b act to produce a sinusoidal-like waveform having approximately uniform amplitude for any received signal regardless of the distance (e.g., k factor) between the transmitting device and the receiving device.

After filter 127, a signal s(t) corresponding to $Ab_{FSK}(t)\cos(2\pi f_{IF} t)$ is presented to the frequency to voltage converter 128 input 129 (where A reflects the uniform amplitude discussed above). The spectral content S(f) of the signal s(t) at the frequency to voltage converter 128 input 129 is shown at FIG. 1. The signal s(t) alternates between a frequency of $f_{IF}+fo$ (for a logical value of "1") and a frequency of $f_{IF}-fo$ (for a logical value of "0"). The spectral content S(f) of the signal s(t) at the frequency to voltage converter 128 input 129 is mapped against the transfer function 160 of the frequency to voltage converter 128 in order to reproduce the baseband signal b(t) at the demodulator output.

Frequency Synthesis

Referring back to the pair of downconversion signals d1(t), d2(t) that are directed to mixers 116, 117, recall that the downconversion signals d1(t) and d2(t) should have a downconversion frequency $f_{down}$ equal to $f_{carrier}-f_{IF}$ for each of the channels $110_1$ through $110_{79}$. For example, for an intermediate frequency $f_{IF}$ of 3 Mhz, the frequency synthesizer 140 is responsible for generating a frequency of 2.399 Ghz in order to receive the first channel $110_1$ (i.e, $f_{carrier}-f_{IF}$=2.402−0.003 Ghz=2.399 Ghz); a frequency of 2.400 Ghz in order to receive the second channel $110_2$; a frequency of 2.401 Ghz in order to receive the third channel $110_3$; . . . etc., and a frequency of 2.477 Ghz in order to receive the $79^{th}$ channel $110_{79}$. A channel select input 141 presents an indication of the desired channel to the frequency synthesizer 140.

Both the transmitting device 165 and the receiving device 166 typically have a frequency synthesizer. A frequency synthesizer 140 is shown in the receiving device 166 (but not the transmitting device 165 for simplicity). Frequency synthesizers typically create their output signals by multiplying a reference frequency (such as the frequency of a local oscillator). As seen in FIG. 1, frequency synthesizer 140 multiplies the frequency of local oscillator 142 to produce downconversion signals d1(t) and d2(t). For example, for a local oscillator 142 reference frequency of 13.000 MHz, frequency synthesizer 140 should have a multiplication factor of 184.53846 to produce downconversion signals d1(t), d2(t) used to receive the first channel $110_1$ (i.e., 84.53846×13.000 MHz=2.399 GHz).

A problem with wireless technology involves deviation from the "designed for" carrier $f_{carrier}$ and/or downconversion $f_{down}$ frequencies (e.g., from non zero tolerances associated with the local oscillator 140 reference frequency). As either (or both) of the carrier and/or downconversion frequencies deviate from their "designed for" values, offsets may be observed in the baseband signal b(t) at the demodulator 106 output.

FIG. 2a shows a baseband signal 250 if the carrier and downconverting frequencies are ideal. As discussed above, the spectral content 253 of the signals produced by filters 127a,b will be centered at the intermediate frequency $f_{IF}$. Since the origin 250 of the frequency to voltage converter transfer curve 260 is centered at the intermediate frequency $f_{IF}$, the output signal 250 has no offset (i.e., has an offset positioned at 0/0 volts)

Errors in the carrier and/or downconversion frequency, however, will cause the spectral content of the signals produced by filters 127a,b to be centered at an offset 254 from the intermediate frequency $f_{IF}$. That is, because $f_{IF}$ in equation 3 corresponds to $f_{carrier}-f_{down}$, if either $f_{carrier}$ or $f_{down}$ (or both) are in error the value of $f_{IF}$ in equation 3 does not correspond to the designed for $f_{IF}$ value (e.g., 3 Mhz) that is centered at the origin of the transfer curve 260. As such, the baseband signal 255 will have an offset 256 with respect to 0.0 volts.

SUMMARY

A method that comprises reducing an offset in a baseband signal by changing a downconversion frequency in response to the offset.

BRIEF DESCRIPTION OF THE DRAWINGS

The present invention is illustrated by way of example, and not limitation, in the Figures of the accompanying drawings in which:

FIG. 4 shows an embodiment for a wireless sub-band;

FIG. 5b shows an embodiment of a design that corresponds to the approach of FIG. 5a;

FIG. 7 shows an embodiment of signaling associated with the feedback circuit of FIG. 6.

DETAILED DESCRIPTION

An apparatus is described having a feedback circuit that couples a wireless receive channel to a frequency synthesizer. A method is described that involves reducing an offset in a baseband signal by changing a downconversion frequency in response to the offset.

Downconverting is the act of reducing or eliminating the frequency of a first signal that is carrying a second signal. Referring back to FIG. 1, as an example, note that the downconversion signals d1(t), d2(t) reduce the carrier frequency of the FSK modulated baseband signal $b_{FSK}(t)$ from $f_{carrier}$ to $f_{carrier}-f_{down}$. A downconversion frequency is a frequency that subtracts from the frequency of the first signal mentioned just above.

Figure 3:
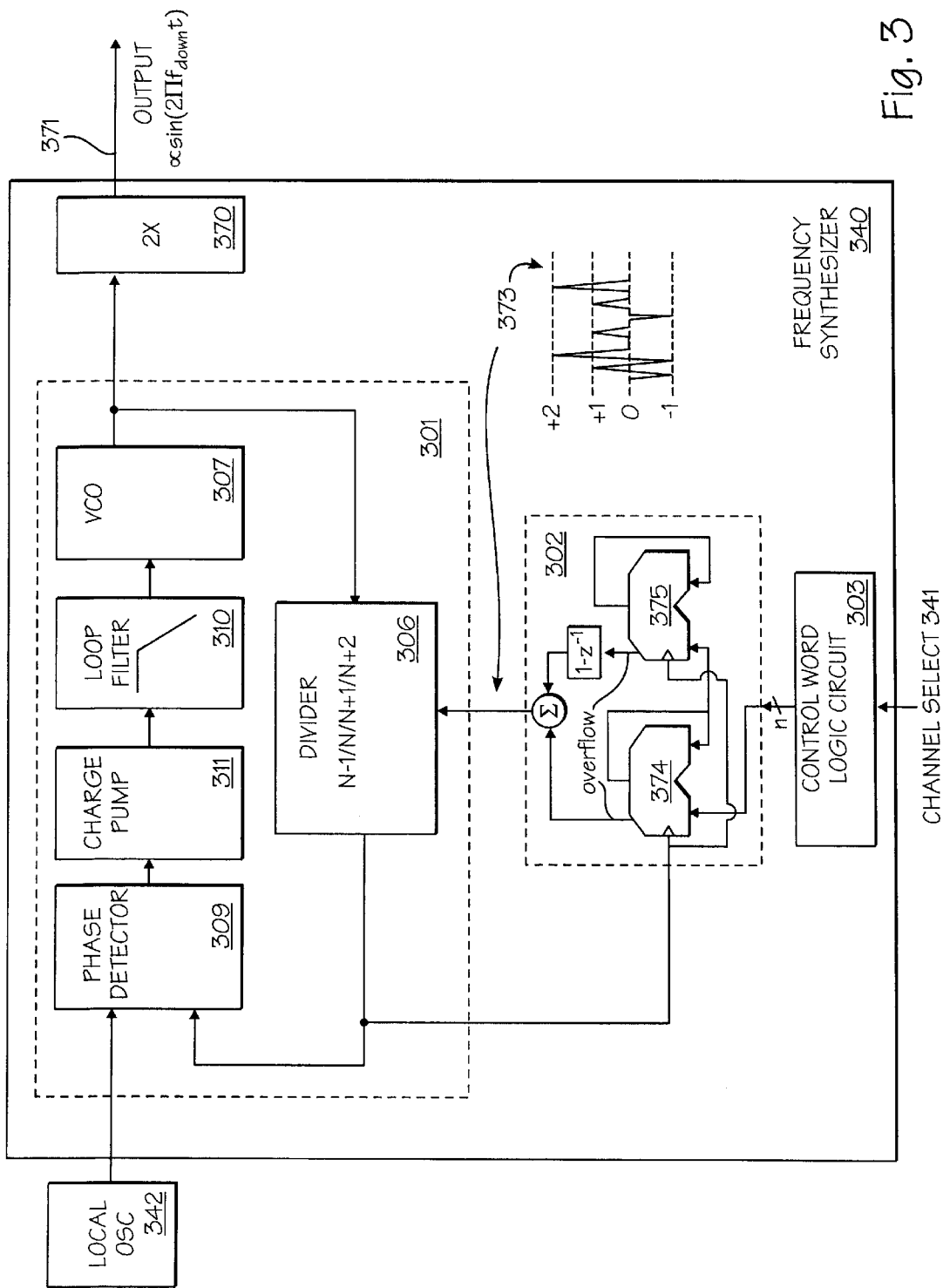
FIG. 3 shows an embodiment of a frequency synthesizer.

FIG. 3 shows an exemplary frequency synthesizer 340 embodiment. A frequency synthesizer 340 may be formed by coupling a sigma delta modulator 302 to a divider 306 that is located within the feedback path of a phase lock loop (PLL) circuit 301. The PLL circuit 301 is used to effectively multiply the frequency of a reference frequency (such as the frequency of a signal from a local oscillator 342 or other frequency reference). As developed in more detail below, the PLL 301 output signal (which is the signal appearing at the output of the voltage controlled oscillator (VCO) 307) has a frequency ($f_{VCO}$) that is a multiple ($N_{AVE}$) of the local oscillator 342 frequency (fosc). That is, $f_{VCO}=N_{AVE}\cdot fosc$.

In the depiction of FIG. 3, the frequency of the synthesizer output 371 signal is the downconversion frequency $f_{down}$ referred to in the background. Note that in the embodiment of FIG. 3, a frequency factor 370 is located between the output of the VCO 307 and the output 371 of the synthesizer 340. The frequency factor 370 allows the VCO 307 to operate at a lower frequency than the downconversion frequency $f_{down}$. Thus, for the embodiment of FIG. 3 where the frequency factor 370 doubles its input frequency, $f_{down}=2f_{VCO}$. Whether or not the VCO 307 output signal should be factored by 2 or another value (or at all) is a decision made by the designer in light of the particular application the synthesizer 340 is directed to.

As a practical example, recalling from the discussion in the background that a synthesizer 340 multiplication factor of 184.53846 can be used to produce a 2.399 GHz downconversion frequency for the first BLUETOOTH channel $110_1$ for a local oscillator 342 frequency of 13.000 MHz; note that the use of the doubling frequency factor 370 allows the multiplication performed by the PLL 301 (i.e., $N_{AVE}$) to be 92.26923 (i.e., 92.26923×2=184.53846). This also corresponds to a VCO 307 output signal frequency $f_{VCO}$ of 1.1995 Ghz.

The frequency $f_{VCO}$ of the VCO 307 output signal is divided within the feedback path of the PLL 301 by a divider 306. A divider 306 is a circuit that emits an output signal having a reduced frequency as compared to its input signal. Divider 306 allows the VCO 307 to operate at a higher frequency than the local oscillator 342 (which effectively provides the desired frequency multiplication performed by the PLL circuit 301). The divider 306 is typically a counter-like circuit that triggers an edge at its output signal after a number of edges are observed in the VCO 307 output signal.

The degree to which the frequency is reduced is referred to as the division or the division factor. Dividers have a second input used to control the division performed by the divider. A divider's division factor "N", will vary (as discussed in more detail further ahead) depending upon the sigma delta modulator 302 output value. Over the course of time in which a constant $f_{VCO}$ is produced, at one instance the division factor may be "N" while at another instance it may be "N−1". Thus, as explained in more detail below, the division factor N varies even if a constant $f_{VCO}$ is desired.

Given that the division factor N varies, the average division factor realized over time ($N_{AVE}$) corresponds to the multiplication performed by the PLL 301. That is, the average frequency of the divider 306 output signal is $f_{VCO}/N_{AVE}$. Phase comparator 309 produces an output based upon the phase difference between the divider 306 output signal and the local oscillator 342 signal. The phase comparator 309 output is effectively integrated or averaged by loop filter 310 (via charge pump 311) which produces the loop filter 310 output voltage that is presented to the VCO 307 input. The VCO 307 output signal frequency $f_{VCO}$ is proportional to the voltage placed at the VCO 307 input.

Ideally, the loop filter 310 output voltage becomes stable (i.e., fixed or "locked") when the frequency of the local oscillator fosc becomes equal to $f_{VCO}/N_{AVE}$; that is, when the VCO 307 output frequency $f_{VCO}$ becomes equal to $N_{AVE}\cdot fosc$. Thus, in this manner, the PLL circuit 301 effectively multiplies the frequency of the local oscillator 342 by a factor of $N_{AVE}$. Frequency synthesis performed according to the technique described above (i.e., modulating the division performed by a divider in a PLL feedback path) is commonly referred to as Fractional-N (or N-Fractional) synthesis.

Note that the proper value of $N_{AVE}$ for each application will depend upon the wireless system being implemented and the local oscillator 342 frequency employed. Other BLUETOOTH related embodiments may employ different local oscillator values (e.g., 8.000 MHz) which will affect the average division factor $N_{AVE}$. Furthermore, wireless approaches other than BLUETOOTH (e.g., HomeRF, IEEE 802.11, GSM, Digitally Enhanced Cordless Telephony (DECT), etc.) which may employ different downconversion frequencies than those employed by BLUETOOTH may implement their own particular combination of local oscillator 342 frequencies and/or average divider factors $N_{AVE}$.

In the embodiment of FIG. 3, a static control word logic circuit 303 is used to translate an indication of the desired channel (presented at the channel select input 341) into a control word (having n bits) that is submitted to the sigma delta modulator 302 input. That is, each channel has an associated, fixed control word value. A unique sigma delta modulator output signal is created for each unique control word value that is presented by the static control word logic circuit 303.

Sigma delta modulators are a class of circuit known in the art that craft an output signal having a beneficial spectral shape (e.g., by describing an input signal with higher frequencies that those emphasized by the input signal. More details concerning sigma delta modulators (which may also be referred to as delta sigma modulators) and their use in Fractional N synthesis may be found in "A Multiple Modulator Fractional Divider", B. Miller and R. J. Conley, IEEE Transactions on Instrumentation and Measurement, vol. 40, no. 3, June 1991.

The sigma delta modulator 302 output signal 373 (which may also be referred to as the modulator output signal, modulator output pattern and the like) controls the average division $N_{AVE}$ performed by divider 306 and, in so doing, controls the frequency multiplication performed by the PLL circuit 301. Because the frequency multiplication performed by the PLL 301 determines the PLL's output frequency $f_{VCO}$; and because the PLL output frequency $f_{VCO}$ affects the value of the downconversion frequency $f_{down}$, the sigma delta modulator 302 output signal 373 is used to control which channel is demodulated.

The sigma delta modulator 302 output signal 373 is a sequence of random or pseudo random values. An example of a sigma delta modulator 302 output signal 373 having four discrete output values (−1, 0, +1 and +2) is shown in FIG. 3. Other output values are possible. The number of output values typically depends upon the order of the sigma delta modulator.

The sigma delta modulator embodiment 302 of FIG. 3 can produce signals having four discrete output values: −1, 0, +1 and +2. The corresponding divider 306 has four discrete division factors: N−1; N; N+1; and N+2. Each of the different division factors may be used to divide the frequency of the VCO output signal. For example, if N of the divider 306 is configured to be equal to 92, the divider 306 is designed to divide at factors of 91, 92, 93 and 94. Thus, if the sigma delta modulator 302 output is −1 the division factor is N−1 (e.g., 91); if the sigma delta modulator 302 output is 0 the division factor is N (e.g., 92); if the sigma delta modulator 302 output is +1 the division factor is N+1 (e.g., 93); and if the sigma delta modulator 302 output is +2 the division factor is N+2 (e.g., 94).

FIG. 4 shows an exemplary embodiment of a BLUETOOTH receiver design having: 1) a divider 306 with an N of 92; 2) a local oscillator 342 having a frequency $f_{OSC}$ of 13.000 MHz; 3) a 2.0 frequency factor 370 between the VCO 307 output and the synthesizer output 371; and 4) an intermediate frequency $f_{IF}$ of 3.000 MHz. FIG. 4 shows a listing of (for each of a sampling of channels): 1) the average value of the sigma delta modulator 302 output signal $SDO_{AVE}$ (which is discussed in more detail below); 2) the average division factor $N_{AVE}$ of the divider 306 (which is equal to the multiplication performed by the PLL circuit 301 as discussed above); 3) the VCO 307 output signal frequency $f_{VCO}$; 4) the downconversion frequency $f_{down}$ (i.e., the synthesizer 340 output signal frequency); and 5) the carrier frequency $f_{carrier}$ (which is equal to $f_{down}+f_{IF}$ as discussed in the background). The divider 306 used for the embodiment of FIG. 4 has divider factors of 91/92/93/94 (i.e., N=92 over N-1/N/N+1/N+2) for the corresponding sigma delta modulator 302 output values of -1/0/+1/+2.

Recall that the sigma delta modulator 302 output (which is responsive to the control word that is produced by the static control word logic circuit 303) controls the average division factor $N_{AVE}$ of the divider 306; and, in so doing, controls the frequency multiplication performed by the PLL circuit 301. For each control word (i.e., for each channel select value 341), the sigma delta modulator 302 will produce a sequence of values having an overall average value that corresponds to the division factor $N_{AVE}$ used to select the appropriate channel.

The average value of the sigma delta modulator output signal, $SDO_{AVE}$, is the average of the values observed in the sigma delta modulator 302 output signal for a particular control word. $SDO_{AVE}$, may therefore be expressed as:

$$SDO_{AVE} = (1/m)\Sigma SDO(T) \qquad \text{Eqn. 4}$$

where: 1) SDO(T) is the sequence of sigma delta modulator output values; and 2) m is the number of number of sigma delta modulator output values within the sequence SDO(T). For example, if a sigma delta modulator output signal continually repeats the sequence: -1, +2, 0, +1, 0 +2, +1, 0, +1, -1; an $SDO_{AVE}$, of 0.500 results because the sum of all the values in the sequence is +5 and there are ten values within the repeated sequence (i.e., 5/10=0.500). Note that the sequence may appear as a multileveled output signal (such as signal 373 of FIG. 3) or as a binary encoded signal (e.g., corresponding to the above sequence: 101, 010, 000, 001, 000, 010, 001, 000, 001, 101 where the highest order bit is a polarity bit).

Consistent with the design embodiment discussed above (where a sigma delta output value of 0 corresponds to a division factor of N) the sigma delta modulator output signal example provided above will continually vary the division factor (within the PLL feedback loop) according to N-1, N+2, N, N+1, N, N+2, N+1, N, N+1, N-1. Straightforward mathematical derivation will show that a sigma delta modulator output signal having an average value $SDO_{AVE}$ as provided in Equation 4 above will cause the divider 306 to have an average division factor $N_{AVE}$ of:

$$N_{AVE} = N + SDO_{AVE} \qquad \text{Eqn. 5}$$

where a sigma delta modulator output value of 0 corresponds to a division factor of N. Thus, referring to FIG. 4, note that the values listed for $N_{AVE}$ are the value of N for the particular embodiment (i.e., 92) added to the values listed for $SDO_{AVE}$.

Note that the embodiment of FIG. 4 uses a sub-band approach. In a sub-band approach, a portion (rather than the entirety) of the range of potentially desirable channels (e.g., channel $110_1$ through channel $110_{79}$) is demodulated with sigma delta modulator signals having an $SDO_{AVE}$ between neighboring sigma delta modulator output values. For example, as seen in FIG. 4, only channels 1 through 20 are demodulated with an $SDO_{AVE}$ between 0 and +1 inclusive. Thus channels 1 through 20 form a sub-band within the frequency band of interest.

The entire range of channels are made available by combining sub-bands. For example, with respect to the embodiment of FIG. 4, channels 21 through 41 may be allocated within one or more other sub-bands. The channels within these other sub-bands may be demodulated, as just a few of many possible approaches, with sigma delta modulator output signals having an $SDO_{AVE}$ between another pair of sigma delta modulator output values (e.g., between +1 and +2 for the embodiment of FIG. 4); or changing the division factor of the divider (e.g., changing from N=92 to N=93) or a combination of both. Whether or not a sub-band approach is to be used and which type of sub-band approach should be used are decisions a designer can make in light of the constraints associated with his/her particular application.

Recall from above that for each control word (i.e., for each channel select value 341), the sigma delta modulator 302 will produce an output signal sequence having a particular $SDO_{AVE}$. For each channel select value 341, the static control word logic circuit 303 presents a control word to the sigma delta modulator for the particular desired channel. The static control word logic circuit 303 may be implemented as a look up table that converts a given channel select value into the proper control word or a logic circuit that calculates the proper control word partially based upon Equation 6 which is described below.

The average value of the sigma delta modulator output signal (for a particular input control word provided by the static control word logic circuit 303) may be expressed as:

$$SDO_{AVE} = CW/CW_{modulo} \qquad \text{Eqn. 6}$$

where CW is the value of the control word provided by the static control word logic circuit 303 (e.g., any binary word having a base ten value between 0 and 2048 inclusive for an eleven bit control word) and $CW_{modulo}$ is the modulo of the control word provided by the static control word logic circuit 303 (e.g., $2^{11}$=2048 for an eleven bit control word). Thus, for an eleven bit control word having a base ten value of 551, a sigma delta modulator will produce an $SDO_{AVE}$ of 551/2048=0.2690. Given that $f_{VCO}=N_{AVE} \cdot fosc$, Equations 5 and 6 may be used to describe the VCO frequency as a function of the control word. That is, $$f_{VCO} = fosc(N + CW/CW_{modulo}) \qquad \text{Eqn. 7}$$

Figure 2A:
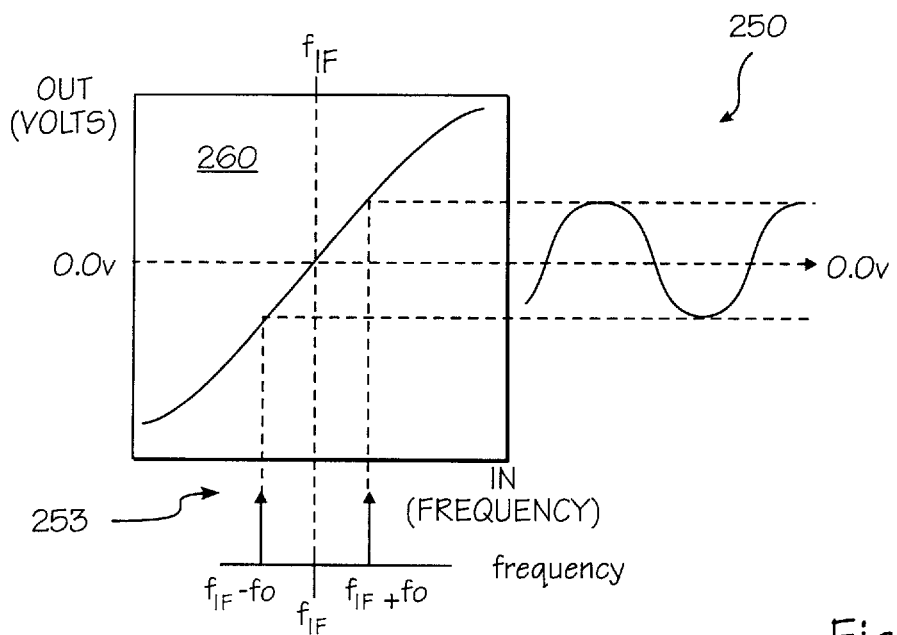
FIG. 2a shows a baseband signal without an offset.
Figure 2B:
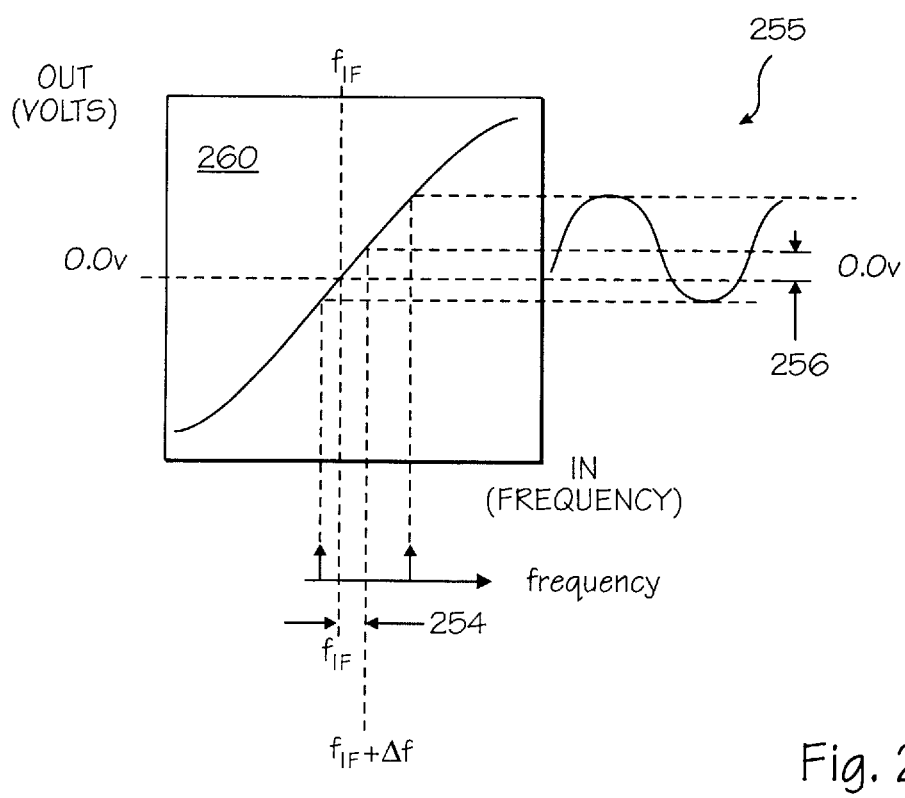
FIG. 2b shows a baseband signal with an offset.

Recall from the background that a problem with wireless technology involves tolerances associated with the carrier $f_{carrier}$ and downconversion $f_{down}$ frequencies. For example, local oscillators within the transmitting and/or receiving devices may have frequencies that deviate from ideal (i.e., "designed for") values. Errors in the carrier and/or downconversion frequency, as seen in FIG. 2b cause the spectral content of the signals produced by filters 127a,b to be centered at an offset 254 from the intermediate frequency $f_{IF}$. As such, the baseband signal 255 will have an offset 256 with respect to 0.0 volts.

Figure 5A:
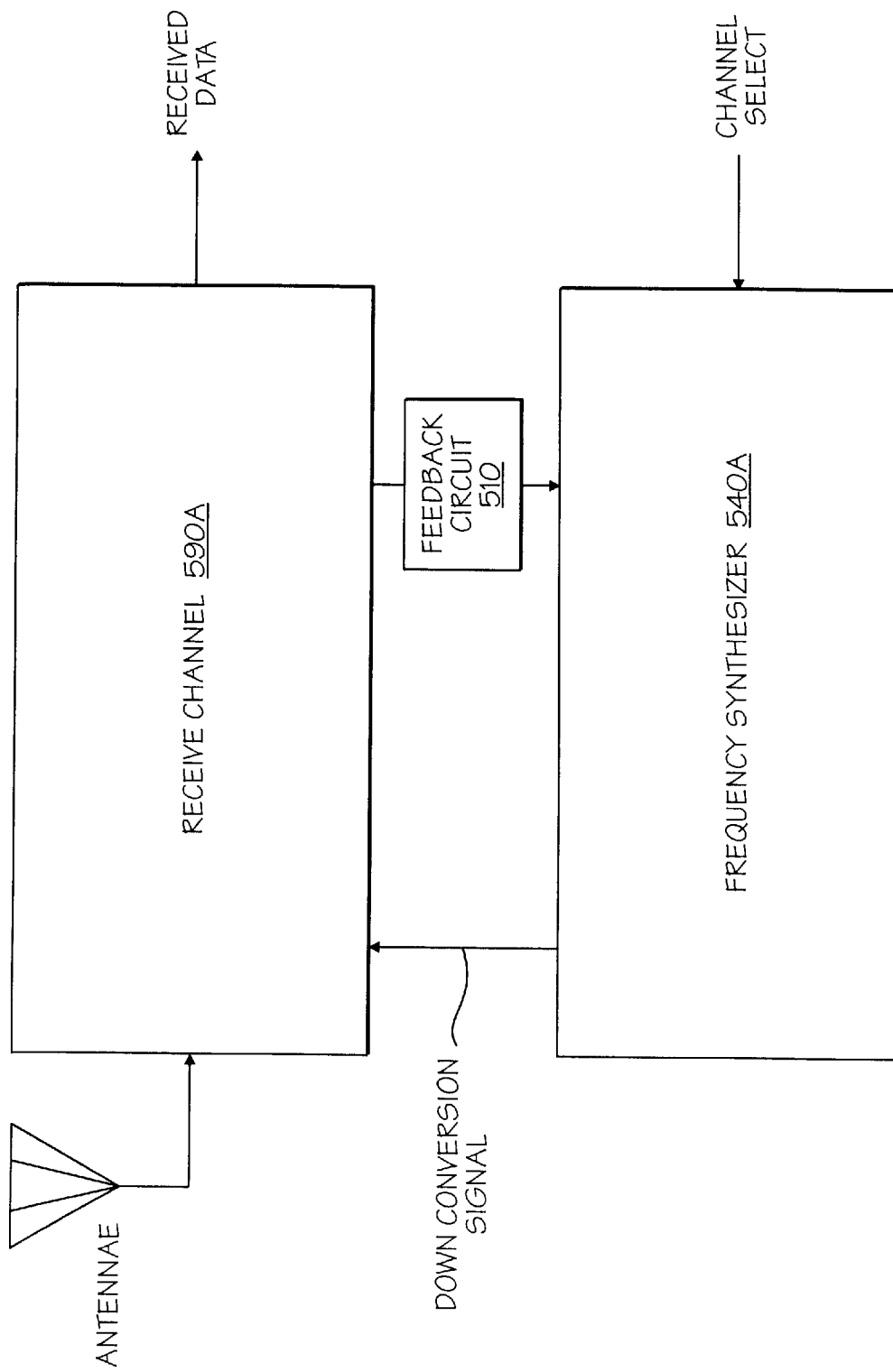
FIG. 5a shows a wireless device having feedback between a frequency synthesizer and a wireless receive channel.
Figure 5B:
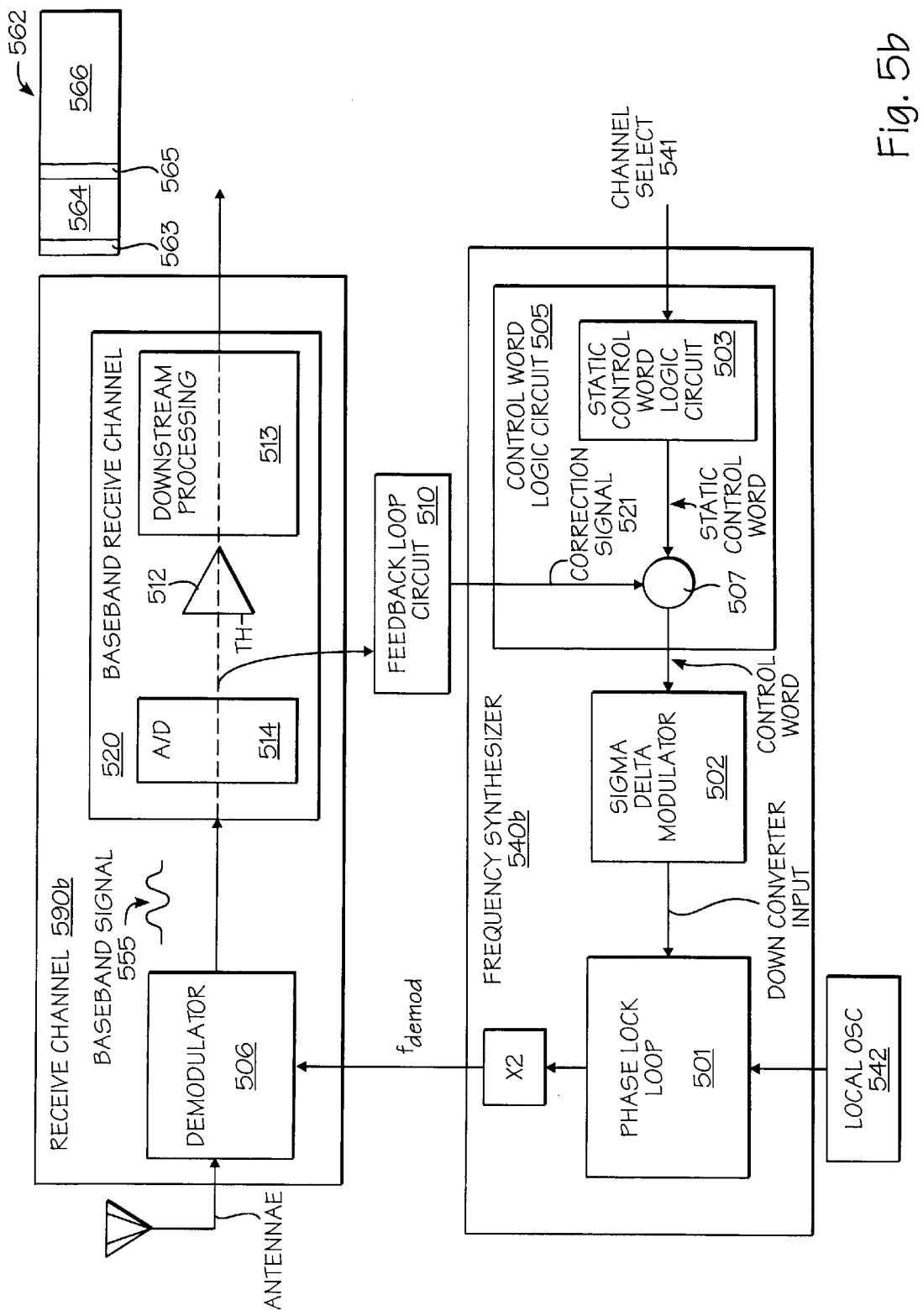

FIG. 5a shows an approach that reduces or eliminates the above described offset. In the approach of FIG. 5ba, a signal (e.g., a baseband signal) received by a wireless receive channel 590a is processed by a feedback circuit 510. A wireless receive channel 590a recovers information sent to a receiving device by a transmitting device. The feedback circuit 510 is coupled to a frequency synthesizer 540a. The frequency synthesizer 540a changes a downconversion frequency $f_{down}$ (that it is used by the receive channel 590a to receive the signal) in response to an offset in the signal so as to cancel or otherwise reduce the offset.

FIG. 5b shows an embodiment of the design approach shown in FIG. 5a. In the embodiment of FIG. 5b, a demodulator 506 is coupled to a baseband receive channel 520. The demodulator 506 and baseband receive channel 520 together form a receive channel 590b. Demodulator 506 may correspond to demodulator 106 of FIG. 1 or another demodulator design. The demodulator 506 presents a demodulated baseband signal 555 to a baseband receive channel 520. Thus baseband signal 555 corresponds to baseband signal 255 of FIG. 2. Baseband receive channel 520 processes the baseband signal 555 provided by the demodulator 506 so its digital data can be recovered.

In the approach of FIG. 5b, a feedback loop circuit 510 (also referred to as a feedback circuit 510 or a feedback loop 510) couples the demodulator 506 output signal 555 (or a signal derived from the baseband signal found along the baseband receive channel 520) to the output of a static control word logic circuit 503. The feedback loop 510 processes the baseband signal 555 (or a signal derived from the baseband signal which may also be referred to as a baseband signal for simplicity) to generate a correction signal 521 that is added to the output of a static control word logic circuit 503.

The static control word logic circuit 503 of FIG. 5b corresponds to the control word logic circuit 303 of FIG. 3. That is, for each channel select value 541, the static control word logic circuit 503 presents a fixed control word (also referred to as a static control word) for a particular desired channel select value 541. The static control word logic circuit 503 may be implemented (as just a few possible approaches) as a look up table that converts a given channel select value into a specific control word for the desired channel, or a logic circuit that calculates the proper control word partially based upon Equation 6 which was described above.

The static control word logic circuit 503 produces a static control word. That is, once a channel select value 541 has been provided, the static control word provided by the static control word logic circuit 503 remains fixed until a new channel select value 541 is provided. Control word logic circuit 505 may therefore be viewed as an improved control word logic circuit having both a static component (represented by the static control word) and a dynamic component (represented by correction signal 521).

The correction signal 521 may therefore be viewed as an adjustment to the value of the static control word provided by the static control word logic circuit 503. The correction signal 521 is therefore a signal that reflects the offset in the baseband signal. Because the correction signal 521 is generated by a feedback loop 506, the control word presented to the sigma delta modulator 502 (i.e., the signal provided by adder 507) eventually settles to a value that reduces or cancels the effect of any frequency offsets between the local oscillators within the transmitting device. As a result, any offset associated with the demodulator 528 output signal (e.g., such as offset 256 seen in FIG. 2b) is removed. Removing the offset in the demodulator 528 output signal allows for easier data recovery of the baseband signal as performed by the baseband receive channel 520.

The baseband receive channel 520, as mentioned above, processes the baseband signal 555 provided by the demodulator 506 so its digital data can be recovered. A baseband receive channel may include: 1) an analog to digital (A/D) converter 514 (that provides a sequence of words representative of a continuous sampling of an analog baseband signal 555); 2) a slicer 512 (also referred to as a comparator) or other decision making circuit that decides whether the words provided by the analog to digital converter 514 are a "1" or a "0"; and 3) downstream processing circuitry 513 that can perform one or more functions including but limited to symbol recovery, clock recovery, storage/queuing, filtering, correlating, pattern detection, etc. It is important to note that baseband receive channel designs other than the particular design 520 of FIG. 5b may be designed by and/or are readily available to those of ordinary skill. As such, the claims that follow should not be construed as limited to the particular baseband receive channel 520 shown in FIG. 5b.

Figure 6:
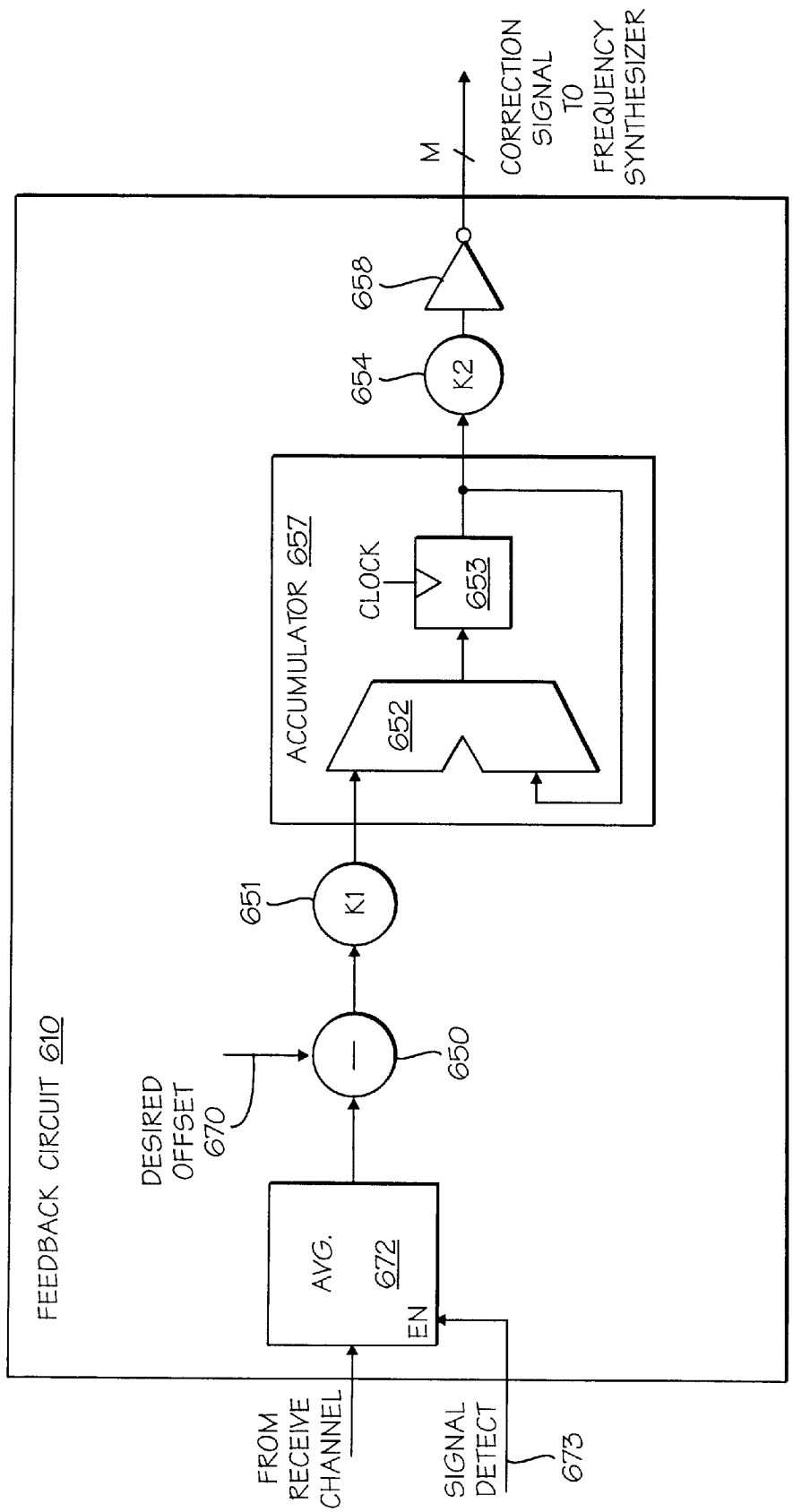
FIG. 6 shows an embodiment of a feedback circuit that may be used as the feedback circuit shown in FIG. 5b.

FIG. 6 shows an exemplary embodiment of circuitry that may be used within the feedback loop circuit 510 of FIG. 5b. In the exemplary feedback circuit 610 of FIG. 6, the output of an A/D converter (e.g., the output of A/D converter 514 of FIG. 5b) is used as an input to the feedback circuit 610. An A/D converter, as discussed above provides a sequence of words representative of a continuous sampling of an analog baseband signal 555. An exemplary depiction of an A/D converter output signal 655 (which may also be referred to as the baseband signal for simplicity) is shown in FIG. 6.

A balanced signal (such as most baseband signals) has an average value equal to its offset. That is, equal amounts of signal energy exist above and below the signal's offset. Thus, for balanced signals, the correction signal 621 to be applied to the sigma delta modulator control word may be generated by taking the difference between the average value of the baseband signal 655 and a desired offset 670.

In the feedback circuit 610 of FIG. 6, the baseband signal 655 is directed to an averaging circuit 672 that takes the average (e.g., by integration) of the received baseband signal 655. The subtractor 650 takes the difference between the baseband signal 655 average and the desired offset 670. Because a baseband signal 655 having an offset of approximately zero is commonly desired, in many embodiments, the desired offset 670 corresponds to a DC voltage of 0.0v (i.e., a null DC component value). Thus, in this case, the desired offset 670 may be a binary word corresponding to an A/D converter output value of 0.0 v (e.g., 00000000 for an eight bit A/D converter output). Because the subtractor 650 takes the difference between its inputs, in cases where the desired offset is zero the subtractor 650 may be eliminated.

In the embodiment of FIG. 6, an offset/signal detect signal 673 that detects the appearance of an offset or signal at the demodulator output may be used to enable the averaging circuit 672. By gating the operation of the averaging circuit 672 until an offset or signal is detected, the averaging circuit 672 is prevented from averaging values that correspond to the baseband signal prior to the appearance of an offset. The signal detect 673 may also be used to enable the output of the feedback circuit (not shown in FIG. 6). Note that in an alternate embodiment, the averaging circuit 672 is disposed of. That is, the baseband signal is fed to the subtractor 650 without being averaged before hand by the feedback circuit 610.

In some embodiments, the baseband signal may have an inherent offset. That is, a signal demodulated with perfectly matching local oscillators in the transmitting and receiving devices still produces an offset. An example of such a case would be a frequency to voltage converter 128 of FIG. 1 having a non zero voltage conversion (that is either intentional or unintentional) for an input frequency corresponding to the intermediate frequency $f_{IF}$.

In such a case (or other cases where an inherent offset exists or is desired), referring back to FIG. 6, a designer may choose to use a non zero desired offset 670. For example if an inherent offset of X volts exists, a desired offset value 670 corresponding to X volts may be used. For simplicity, the discussion that continues is directed to the embodiment of FIG. 6 having a desired offset 670 of zero.

The output of the subtractor 650 is typically referred to as an error signal 624. Note that a first scaling unit 651 may be used to scale the amplitude of the error signal (i.e., multiply the error signal by a factor k1). Generally, as the scaling factor k1 increases, the correction signal 621 produces larger adjustments to the static control word for a given offset in the baseband 655 signal.

That is, for the same offset in the baseband signal, a first feedback circuit 610 having a k1=x will produce a greater adjustment to the static control word than a second feedback circuit 610 having a k1=y where x>y (with other scaling factors within the feedback loops being the same as between the two circuits). A greater adjustment for the same offset corresponds to a greater loop bandwidth for the first feedback circuit as compared to the second feedback circuit.

Better said, because the first feedback circuit has a greater "reaction" than the second feedback circuit to the same offset, the first feedback circuit has the potential to cancel out an offset in the baseband signal (via the adjustments made to the static control word as described in more detail below) in a shorter amount of time than the second feedback circuit. Note that k1 values above and below 1.00 are possible.

After scaling the error signal 624 by a scaling factor k1, the scaled error signal 625 is presented to an accumulator 657. An accumulator 657 may be formed as shown in FIG. 6 with an adder 652 having its output node coupled to a storage element 653 (e.g., a register or flip-flop capable of holding the adder 652 output word) where the storage element 653 is coupled (via a feedback arrangement) to one of the adder 652 input nodes.

In order to produce a new accumulator output value, the accumulator 657 adds its current output value to a new scaled error signal 625 value. That is (in the embodiment of FIG. 6) when a new scaled error signal 625 value is presented to the adder 652, the adder 652 presents the storage element 653 with the summation of the accumulator's current output value and the new scaled error signal value. This summation is then clocked into the storage element 653 to produce a new accumulator output value. The accumulator output may then be scaled again (at the designer's option) with another scaling unit 656 and/or inverted by an inverter 658 to ensure that negative feedback is employed.

Recall from the discussion of FIG. 5b that the feedback loop 510 output (i.e., the correction signal 521) may be viewed as an adjustment (to the value of the static control word that is provided by the static control word logic circuit 503) that eventually settles to a value that approximately cancels an offset within the baseband signal. FIGS. 7a through 7d are used to discuss an example of the manner in which the feedback loop output eventually settles to such a value.

FIG. 7a shows the initial moments of a baseband signal 755a (as viewed from the output of an A/D converter) that is received without the assistance of a feedback circuit. In FIG. 7a, a packet of information sent by a transmitting device arrives at the receiving device at time T0. A corresponding offset 756a in the baseband signal 755a is observed. Note that a grace period Tg may exist between the moment that a packet actually arrives T0 and the moment Tx that a change in offset is first observed.

This grace period Tg typically results from a latency designed into the transmitting device between the moment that the carrier frequency $f_{carrier}$ begins to be transmitted and the moment the baseband signal (i.e., the packet) begins to be modulated. Typically, in order to ensure that the entire packet is reliably sent, the transmission of the baseband signal is delayed by Tg after the carrier frequency $f_{carrier}$ is enabled. It is important to point out, however, that the present discussion applies to applications where no such grace period exists (i.e., Tg=0).

FIG. 7a also shows the initial moments of a baseband signal 755b received with the assistance of the feedback circuit. FIG. 7a shows possible threshold levels TH1, TH2 above and below 0.0 volts that may be used to trigger the signal detect 773 signal. Referring to FIGS. 6 and 7, when the signal detect signal 673, 773 is latched at time Ty, the averaging circuit begins to average A/D converter output words and a correction signal 721 is produced.

Five curves are respectively shown in FIGS. 7a through 7e that relate to the reception of a baseband signal with the assistance of a feedback circuit. Referring to FIGS. 6 and 7a through 7e, the first curve 755b of FIG. 7a corresponds to the baseband signal. The second curve 772 of FIG. 7b corresponds to the average of the baseband signal 755b as produced by the averaging circuit 672. The third curve 721 of FIG. 7c is the correction signal 621 produced by the feedback circuit 610. The fourth curve 705 of FIG. 7d corresponds to the value of the control word that is presented to the sigma delta modulator. The fifth curve 706 of FIG. 7e corresponds to the downconversion frequency $f_{down}$ that is produced by the frequency synthesis activity of the receiving device as a result of the control word value 705 shown in FIG. 7d.

In various forms of wireless communications (e.g., Code Division Multiple Access (CDMA) based schemes such as BLUETOOTH), an algorithm executed by the receiving device determines a window of time as to when a packet should arrive as well as the specific channel that the packet will be transported over. Channels (such as channels $110_1$ through $110_{79}$) were first discussed in the background.

Recalling that the downconversion frequency is determined by the value of a control word that is presented to a sigma delta modulator, the downconversion frequency 710 at the start of the window of time (which begins at a time prior to Tx in FIGS. 7a through 7e) is determined by the static control word value 711 (as produced by static control word logic circuit 503 of FIG. 5b which is responsive to the channel select value 541).

When the carrier is first detected (at time Tx as seen in FIG. 7) the offset in the baseband signal 755b begins to appear. As discussed in the background with respect to FIG. 2b, the offset may be the result of slight inaccuracies associated with the frequency synthesis performed by the transmitting and/or receiving devices. Note that in cases where such inaccuracies are non-existent (e.g., because both the transmitting and receiving devices are able to synthesize perfect frequencies), the static control word value 711 produced by the static control word logic circuit 503 is apt to be sufficient such that no offset exists in the baseband signal.

Figure 1:
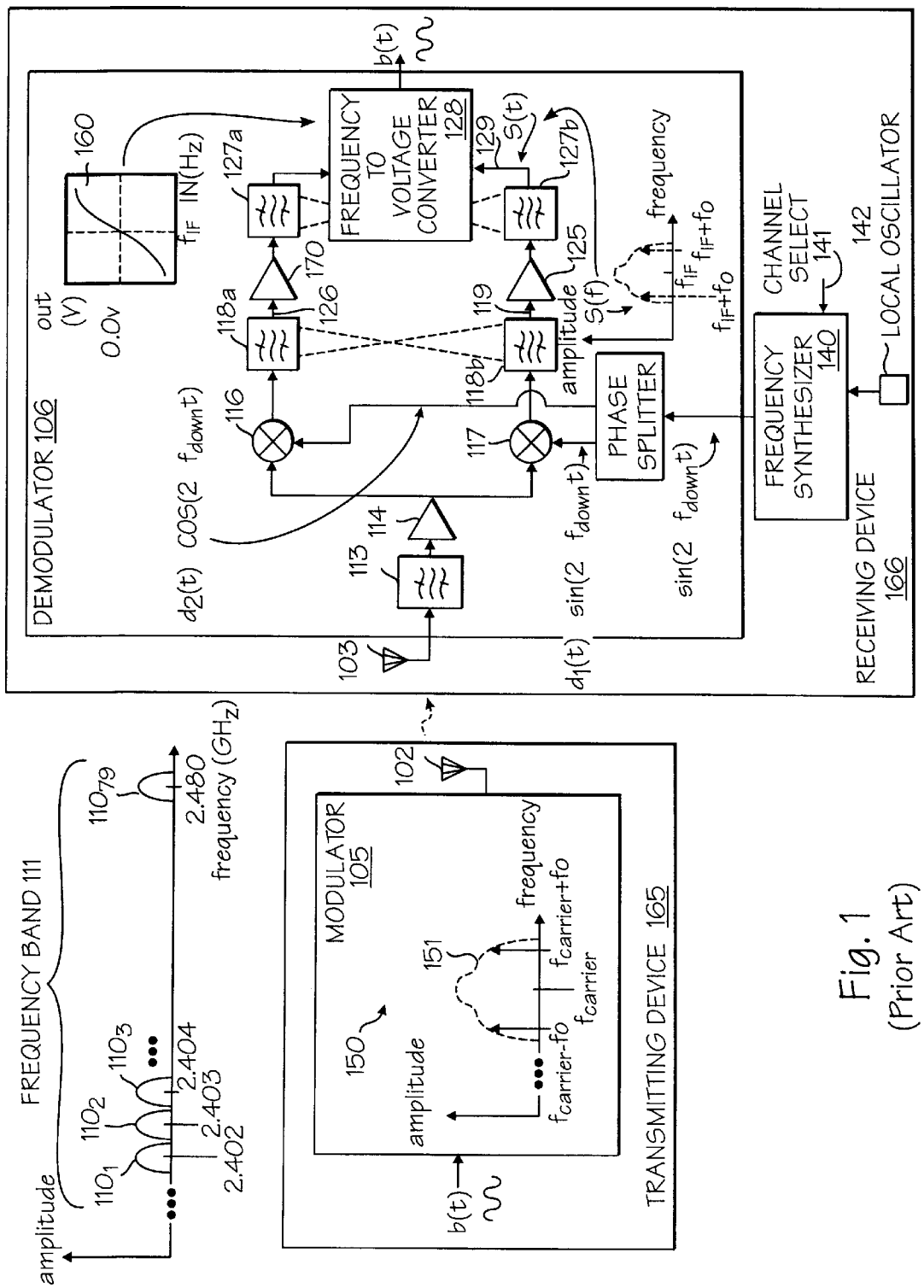
FIG. 1 shows an embodiment of a demodulator.

Referring to equations 2 and 3 and FIG. 1 as well as FIGS. 7a through 7e, for the frequency to voltage conversion 160 shown in FIG. 1, a positive offset in the baseband signal 755b as seen in FIG. 7a corresponds to $f_{carrier}-f_{down}$ being greater than $f_{IF}$ (rather than being equal to $f_{IF}$). In this case, the downconversion frequency should be increased above its initial value 710 such that $f_{carrier}-f_{down}$ is approximately equal to $f_{IF}$ (i.e., $f_{down}$ is approximately equal to $f_{carrier}-f_{IF}$). When the downconversion frequency is increased to a value at or near $f_{carrier}-f_{IF}$, the offset in the baseband signal is reduced to approximately zero.

The increase in downconversion frequency is achieved by effectively increasing the value of the control word above the value 711 presented by the static control word logic circuit 503. The feedback circuit applies the desired increase to the value of the static control word 711 via correction signal 721. Comparing the correction signal curve 721 to the control word value curve 705, note that the correction signal 72 represents a series of adjustments) made to the static control word value 711 after the packet arrives (at time T0).

That is, is the correction signal 721 is applied via adder 507 of FIG. 5b (note the word value axis of FIGS. 7c and 7d are not at the same scale thus the correction signal appears smaller in than in FIG. 7c). As the series of adjustments continue to "tweak" the value of the control word presented to the sigma delta modulator, the downconversion frequency $f_{down}$ approaches the desired value of approximately $f_{carrier}-f_{IF}$. The adjustments cease when the baseband signal 755b offset disappears.

Initially, the large offset at time Ty produces a jump in the average value 772 of the baseband signal. This jump (or a scaled version of it) is accumulated the accumulator 657 and appears in the correction signal 721. As a result the control word value rises at time Ty as well. The increase in the control word value at time Ty causes the downconversion frequency to increase as seen at region 717 of the downconversion frequency curve 706. The increase in the downconversion frequency causes the baseband signal offset to drop as seen at region 718 in FIG. 7a. The decrease in offset results from the downconversion frequency being adjusted to a value that is closer to $f_{carrier}-f_{IF}$.

The downconversion frequency continues to be increased by the feedback loop adjustments until downconversion frequency "overshoots" the desired frequency of $f_{carrier}-f_{IF}$. That is, the downconversion frequency becomes greater than $f_{carrier}-f_{IF}$. Overshoot is observed at region 721 in the downconversion frequency curve 706. The overshoot is caused by the accumulator 657 continually accumulating positive baseband signal average 772 values between times Ty and Tz.

After time Tz, the baseband signal average 772 becomes negative and the accumulator 657 begins to accumulate negative values. This will lower the correction signal value 721 as seen in FIG. 7c. The lower correction value after time Tz causes the control word value 705 and downconversion frequency 706 to drop and begin to approach $f_{carrier}-f_{IF}$. As the accumulator continues to accumulate negative baseband signal values, the correction signal 721, control word value 705 and downconversion frequency 706 drop. After the downconversion frequency 706 crosses $f_{carrier}-f_{IF}$ the baseband signal 755b offset becomes positive and the average value 772 of the baseband signal rises.

In light of the above discussion, it is apparent that when the downconversion frequency 706 is less than $f_{carrier}-f_{IF}$, the feedback circuit causes an eventual increase in the downconversion frequency 706. Furthermore, when the downconversion frequency 706 is greater than $f_{carrier}-f_{IF}$, the feedback circuit causes an eventual decrease in the downconversion frequency 706. As such, the downconversion frequency 706 eventually settles to a value of approximately $f_{carrier}-f_{IF}$. Note that after the settling time constant (i.e., the time consumed reaching a downconversion frequency of approximately $f_{carrier}-f_{IF}$) has been surpassed the gain of the feedback loop may be lowered (e.g., by lowering the scaling factor k1 in FIG. 6) or the feedback loop may be disabled such that the digital data of the received packet does not disrupt the correction signal setting.

For simplicity, phase delay in the feedback circuit has not been addressed (e.g., the downconversion frequency is assumed to change instantaneously with a change in control word value). Those of ordinary skill will be able to configure stable loops even though finite delays exist throughout the recursive process described above. Furthermore, analog curves have been drawn in FIGS. 7a through 7e for simplicity. It is to be understood however, that they may actually appear as discrete signals rather than continuous signals.

It will also be helpful to add a few comments regarding the precision and extent to which downconversion frequency adjustments may be made. From Equation 6, it is apparent that the resolution of the frequency adjustments made to the phase lock loop output signal correspond to $fosc/CW_{modulo}$. That is, if the control word value CW of Equation 7 is incremented by one, the phase lock loop frequency fvco increases by $fosc/CW_{modulo}$. For a synthesizer design where the phase lock loop frequency is multiplied by 2.0 to produce the downconversion frequency (as demonstrated in the embodiment discussed with respect to FIG. 4), each increment/decrement in the value of the feedback circuit output word increases/decreases the downconversion frequency by $2fosc/CW_{modulo}$.

Generally, the resolution may be expressed as $kfosc/CW_{modulo}$ where k indicates any post phase lock loop frequency multiplication (where k=1.00 if none exists).

Note that the maximum amount of adjustment that may be applied by the feedback circuit is limited by the size of the feedback circuit output word. That is, if the feedback circuit output word is limited to 5 bits the maximum/minimum downconversion frequency adjustment that may be applied is $+/-32kfosc/CW_{modulo}$ (because 11111 in base two is equal to 32 in base ten). In various embodiments, the size of the control word is designed to accommodate for a worst case offset in the baseband signal (including room for the feedback circuit overshoot or undershoot that results from such a worst case offset).

It is also important to point out that the offset of the baseband signal will be canceled by the feedback approach discussed above regardless if the baseband signal is averaged. For example, in an alternate embodiment an unaveraged baseband signal is presented to the subtractor 670 within the feedback circuit 610 of FIG. 6. Note that if the number of 1s and 0s in the baseband signal are approximately the same (i.e., the baseband signal is "balanced"), the baseband signal should have no offset other than an offset caused by the frequency synthesis inaccuracies discussed above (if any).

Referring back to FIG. 5b, note that the baseband receive channel 511 of FIG. 5b includes an A/D converter 514 followed by a slicer 512 that determines whether or not the symbols associated with the baseband signal correspond to a 1 or a 0. The slicer 512 then feeds downstream circuitry 513 (e.g., a correlator circuit that correlates the 1s and 0s from the slicer 560 against a predetermined pattern). If the correlator determines that the predetermined code "matches" (within an acceptable amount of tolerance) the sequence of 1s and 0s produced by the slicer 512, the incoming information is recognized as being intended for the reception of the receiving device (rather than some other receiving device).

For example, in BLUETOOTH applications, information is transmitted in the form of packets. An exemplary packet structure 562 is shown in FIG. 5b. Note that the packet has a four bit preamble 563, a 64 bit "synch word" 564, a four bit post-amble 565 and the random customer data (plus header) 566 transported by the packet 562. The "synch word" is unique to the wireless connection that involves the receiving device. That is, a receiving device understands whether or not a packet received at its antennae is being sent to the receiving device (or another receiving device) by correlating (via a correlation circuit within downstream processing circuitry 513) the synch word 564 against the connection's unique word.

Because offsets associated with frequency synthesis inaccuracies may cause misinterpretation by the slicer 512 of the 1s and 0s propagated by the baseband signal, (i.e., the slicer incorrectly interprets a 1 as 0 or a 0 as a 1), an incentive exists to either: 1) eliminate the offset associated with the baseband signal rapidly so that the slicer 512 accurately interprets the baseband signal before the number of misinterpretations allowed by the tolerance of the correlation is exceeded; or 2) develop a slicer 512 capable of handling baseband signals with large offsets. Employment of the feedback approach discussed above may be used with either of these approaches as briefly discussed below.

In the former case, the baseband signal offset may be rapidly eliminated if the settling time of the feedback circuit (i.e., the time consumed in reaching a downconversion frequency of approximately $f_{carrier}-f_{IF}$) is reduced or minimized (e.g., by designing the scaling units 651, 654 within the feedback circuit to have a sufficiently high gain). Likewise the responsivity/settling time of the sigma delta modulator and phase lock loop should be similarly designed such that new downconversion frequencies are produced shortly after a new feedback loop output word adjusts the previous sigma delta modulator control word. Again, those of ordinary skill can configure designs in light of an understanding of loop dynamics, latency reduction design techniques and the correlation tolerances associated with their particular application.

In some applications and/or technology environments, however, a feedback loop, sigma delta modulator and phase lock loop circuit having sufficiently low latency that allows for the rapid elimination of the offset (such that slicer misinterpretations are still within the tolerances allowed by a correlation circuit) may be too expensive to implement and/or technically impracticable in light of the design constraints that exist.

In such cases, a second approach may be undertaken where the slicer 512 is designed to be capable of handling baseband signals with large offsets. By the nature of electronic circuits, however, such a slicer 512 may be more susceptible to noise in the receive channel. That is, a slicer 512 that is able to quickly adjust an internal threshold (against which 1s and 0s are determined) in order to properly interpret data having a sudden, large offset may undesirably adjust the same internal threshold (thereby causing misinterpretation of data) as a result of a noise spike appearing on the baseband signal.

Thus, in order to compensate for this problem, two effective slicer's may be utilized over the course of a received packet. Assume for simplicity that both slicer's exist within the slicer 512 of FIG. 5b. A first slicer having the ability to quickly adjust an internal threshold is used initially during the initial moments of the reception of the baseband signal. Because the slicer 512 has the ability to rapidly adjust its internal threshold, the slicer is able to properly interpret the baseband signal even though it suddenly arrives with a large offset. An example of a slicer design as described just above may be found in a U.S. Patent entitled Method and Apparatus for Peak Tracking a Baseband Signal, filed on Sep. 27, 2000.

While the first slicer is interpreting the baseband signal, the feedback circuit 510 acts to reduce the offset. Because the first slicer is able to adjust its threshold in light of sudden change in the offset of the baseband signal, the first slicer is able to properly interpret the baseband signal while its offset is being reduced. Eventually, when the feedback circuit approximately settles to a value that produces a downconversion frequency of $f_{carrier}-f_{IF}$, (i.e., when the offset in the baseband signal is approximately canceled), the baseband receive channel 511 "switches over" from the first slicer to a second slicer. The settling time may be fixed (e.g., by understanding the time constant of the feedback circuit) or may be measured (e.g., by monitoring the magnitude of the changes made to the sigma delta modulator control word).

The second slicer may be designed to dynamically calculate its threshold (e.g., by calculating a running average of the baseband signal) with a bandwidth less than the bandwidth of the first slicer. Because the second slicer has a lower threshold calculation bandwidth it changes its threshold at a slower rate as compared to the first slicer. As a result, a noise spike on the baseband signal should not cause a sudden change in the threshold level.

By interpreting a first portion of a baseband signal with a first, higher threshold bandwidth slicer and a following portion (e.g., the remainder) of a baseband signal with a second, lower threshold bandwidth slicer, misinterpretations caused by offsets in the baseband signal are minimized (by the use of the first slicer) and slicer misinterpretations caused by noise are minimized (by the use of the second slicer). As a result, the receive channel is configured to approximately maximize its ability to properly interpret the baseband signal.

In another alternative embodiment, referring to FIG. 5b, two A/D converters may be employed. A first A/D converter 514 may be used to feed the slicer 512 while a second A/D converter (not shown) may be used to feed the feedback circuit 510. This approach provides the designer with better flexibility as to the digital word widths and A/D oversampling rates employed in the two respective channels (i.e., the baseband receive channel 511 and feedback circuit 510 channel). That is, the designer may employ a first digital word width and A/D oversampling rate that best suits the baseband receive channel 51 land a second digital word width and A/D oversampling rate that best suits the feedback circuit 510 channel.

It is important to point out that that the baseband receive channel 511 shown in FIG. 5b is exemplary. That is, other applications (e.g., non BLUETOOTH related applications as well as BLUETOOTH related applications) may receive wireless information by means other than an A/D converter that feeds a slicer. An offset in the baseband signal may be removed via feedback techniques as discussed above regardless of the precise manner in which digital information is interpreted or qualified by a receiving device. As such the feedback approach discussed above should not be construed as limited to the particular receiver channel 511 shown in FIG. 5b. The baseband receive channel is deemed to include its input from the demodulator 506.

It also important to point out that feedback loop circuits other than that shown in FIG. 6 may be employed. Various feedback circuit techniques are known in the art. Thus, feedback circuit approaches other than the particular approach of FIG. 6 are possible that fall within various known feedback classes such as proportional integration, proportional differentiation and proportional integration/differentiation. Various stabilizing dynamics may be designed for as well (e.g., underdamped, overdamped, critically damped, first order, second order, etc.).

Furthermore, it is important to point out that even though the embodiments discussed above have been limited to a digital domain feedback circuit, analog feedback circuits are possible as well. For example, in an alternative embodiment, an analog baseband signal from the demodulator 506 is fed to the feedback circuit. The feedback circuit 510 would therefore be constituted by analog functional blocks (e.g., an analog rather than digital subtractor, an analog rather than digital accumulator, etc.). A such, the feedback circuit processes analog signals. An A/D converter may inserted before the adder 507 that adds the feedback circuit output to the static control word.

It is important to point out that the discussion above is applicable to other applications besides baseband signal processing for a BLUETOOTH device. That is, the present teachings may be used to process any signal having a sudden offset. For example, the present teachings are also applicable to other frequency shift keyed wireless technologies besides BLUETOOTH such, as just a few examples, HomeRF, IEEE 802.11, GSM and Digitally Enhanced Cordless Telephony (DECT).

Embodiments of the present discussion may be manufactured as part of a semiconductor chip (e.g., as manufactured by a planar semiconductor manufacturing process). Note also that embodiments of the present description may be implemented not only as part of a semiconductor chip but also within machine readable media. For example, the designs discussed above may be stored upon and/or embedded within machine readable media associated with a design tool used for designing semiconductor devices. Examples include a netlist formatted in the VHSIC Hardware Description Language (VHDL) language, Verilog language or SPICE language. Some netlist examples include: a behaviorial level netlist, a register transfer level (RTL) netlist, a gate level netlist and a transistor level netlist. Machine readable media also include media having layout information such as a GDS-II file. Furthermore, netlist files or other machine readable media for semiconductor chip design may be used in a simulation environment to perform the methods of the teachings described above.

Thus, it is also to be understood that embodiments of this invention may be used as or to support a software program executed upon some form of processing core (such as the CPU of a computer) or otherwise implemented or realized upon or within a machine readable medium. A machine readable medium includes any mechanism for storing or transmitting information in a form readable by a machine (e.g., a computer). For example, a machine readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus, comprising:
 a feedback path to a control word circuit, said control word circuit having an output that provides a control word to a sigma delta modulator, said feedback path to provide a correction signal to said control word circuit, said correction signal to correct for a demodulated FSK baseband signal offset, said control word having a value that determines a sigma delta modulator output signal average value, said sigma delta modulator output signal average value determinative of a frequency multiplication performed by a phase locked loop circuit, said frequency multiplication determinative of a downconversion frequency employed during reception of said baseband signal.

2. The apparatus of claim 1 wherein said feedback path stems from an analog to digital converter output.

3. The apparatus of claim 2 wherein said analog to digital converter has an input coupled to a demodulator output.

4. The apparatus of claim 3 wherein said demodulator further comprises a voltage-to-frequency converter.

5. The apparatus of claim 2 wherein said analog to digital converter output also feeds the input of a slicer circuit.

6. The apparatus of claim 1 wherein said control word circuit further comprises a static control word circuit that generates a static control word in response to a channel select value, said channel select value used to select one of a plurality of channels within a frequency band.

7. The apparatus of claim 6 wherein said control word circuit further comprises a circuit that modifies said static control word with said correction signal so as to provide said control word.

8. The apparatus of claim 1 wherein said feedback path further comprises a subtractor that takes a difference between said demodulated FSK baseband signal offset and a desired offset for said demodulated FSK baseband signal.

9. The apparatus of claim 1 wherein said feedback path further comprises a scaling unit that multiplies by a factor a difference between said demodulated FSK baseband signal offset and a desired offset for said demodulated FSK baseband signal.

10. The apparatus of claim 1 wherein said feedback path further comprises an accumulator that accumulates error signals that are indicative of a difference between said demodulated FSK baseband signal offset and a desired offset for said demodulated FSK baseband signal.

11. The apparatus of claim 1 wherein said feedback path further comprises an averaging circuit that averages said demodulated FSK baseband signal.

12. The apparatus of claim 1 wherein said feedback path is a first order feedback path.

13. The apparatus of claim 1 wherein said feedback path is a second order feedback path.

14. An apparatus, comprising:
 a) a phase lock loop circuit that performs frequency multiplication, said frequency multiplication determined by the division performed by a divider placed along a first feedback path within said phase lock loop circuit;
 b) a sigma delta modulator having an output coupled to said divider, said division performed by said divider determined by the average value of a sigma delta modulator output signal;
 c) a control word circuit having an output coupled to said sigma delta modulator, said average value of said sigma delta modulator output signal determined by the value of a control word produced by said control word circuit; and d) a second feedback path between said control word circuit and a baseband receive channel that processes a demodulated FSK baseband signal that was received with a downconversion signal, said downconversion signal having a dowconversion frequency determined by said frequency multiplication.

15. The apparatus of claim 14 wherein said second feedback path stems from an analog to digital converter output.

16. The apparatus of claim 15 wherein said analog to digital converter has an input coupled to a demodulator output.

17. The apparatus of claim 16 wherein said demodulator further comprises a voltage-to-frequency converter.

18. The apparatus of claim 15 wherein said analog to digital converter output also feeds the input of a slicer circuit.

19. The apparatus of claim 14 wherein said control word circuit further comprises a static control word circuit that generates a static control word in response to a channel select value, said channel select value used to select one of a plurality of channels within a frequency band.

20. The apparatus of claim 19 wherein said control word circuit further comprises a circuit that modifies said static control word with said correction signal so as to provide said control word.

21. The apparatus of claim 14 wherein said feedback path further comprises a subtractor that takes a difference between said demodulated FSK baseband signal offset and a desired offset for said demodulated FSK baseband signal.

22. The apparatus of claim 14 wherein said feedback path further comprises a scaling unit that multiplies by a factor a difference between said demodulated FSK baseband signal offset and a desired offset for said demodulated FSK baseband signal.

23. The apparatus of claim 14 wherein said feedback path further comprises an accumulator that accumulates error signals that are indicative of a difference between said demodulated FSK baseband signal offset and a desired offset for said demodulated FSK baseband signal.

24. The apparatus of claim 14 wherein said feedback path further comprises an averaging circuit that averages said demodulated FSK baseband signal.

25. The apparatus of claim 14 wherein said second feedback path is a first order feedback path.

26. The apparatus of claim 14 wherein said second feedback path is a second order feedback path.

27. A method, comprising:
reducing an offset in a demodulated FSK baseband signal by changing a downconversion frequency in response to said offset, said changing a downconversion frequency further comprising:
a) changing a value of a control word in response to said offset;
b) providing said changed control word value to a sigma delta modulator;
c) providing a changed feedback divider input signal average value to a feedback divider in response to said changed control word value, said feedback divider within a phase locked loop circuit;
d) changing a voltage controlled oscillator output signal frequency in response to said changed feedback divider input signal average value, said voltage controlled oscillator within said phase locked loop circuit, said changed voltage controlled oscillator output signal frequency causing said changing of said downconversion frequency.

28. The method of claim 27 further comprising taking the difference between a desired offset for said demodulated FSK baseband signal and said offset to produce a correction signal that causes said changing of said control word value.

29. The method of claim 28 wherein said correction signal is derived from an accumulation of error signal values, said error signal values being zero when said downconversion frequency equals $f_{carrier}-f_{IF}$.

30. The method of claim 29 wherein an error signal value is scaled prior to its being accumulated with previous error signal values.

31. The method of claim 28 wherein said desired offset is zero volts.

32. The method of claim 28 wherein said changing a control word value further comprises adding said correction signal to a static control word, said change in control word value causing said change in downconversion frequency.

33. The method of claim 27 further comprising waiting for a packet to arrive prior to said offset being detected, said packet being transported by said demodulated FSK baseband signal.

34. The method of claim 33 further comprising determining when to wait for said packet by executing an algorithm.

35. The method of claim 34 wherein said algorithm further identifies which of a plurality of channels within a frequency band said packet will arrive upon.

36. The method of claim 27 wherein an increase in said control word value causes an increase in said downconversion frequency.

37. The method of claim 27 wherein an increase in said control word value causes an increase in said downconversion frequency.

38. The method of claim 27 wherein said baseband signal is a BLUETOOTH baseband signal.

39. The method of claim 27 wherein said baseband signal is a HomeRF baseband signal.

40. The method of claim 27 wherein said baseband signal is an IEEE 802.11 baseband signal.

41. The method of claim 27 wherein said baseband signal is a DECT baseband signal.

42. The method of claim 27 wherein said baseband signal is a GSM baseband signal.

43. An apparatus, comprising:
a circuit having an input positioned to detect an offset in a demodulated FSK baseband signal, said circuit having an output positioned to change a sigma delta modulator output signal average value in response to said offset so as to reduce said offset, said sigma delta modulator output signal average value determinative of a frequency multiplication performed by a phase locked loop circuit, said frequency multiplication determinative of a downconversion frequency used to receive said baseband signal.

44. The apparatus of claim 43 wherein said input is positioned at an analog to digital converter output.

45. The apparatus of claim 44 wherein said analog to digital converter has an input coupled to a frequency to voltage converter output.

46. The apparatus of claim 44 wherein said analog to digital converter output is also coupled to a slicer circuit input.

47. The apparatus of claim 43 further comprising a second circuit, said second circuit having a first input that is coupled to said circuit output, said second circuit having a second input that is coupled to an output of a static control word circuit that provides a static control word, said second circuit having an output coupled to an input of said sigma delta modulator, said static control word determined by said static control word circuit in response to a channel select value, said channel select value used to select one of a plurality of channels within a frequency band.

48. The apparatus of claim 47 wherein said second circuit is an adder.

49. The apparatus of claim 43 wherein said circuit further comprises a subtractor that provides a difference between said offset and a desired offset for said demodulated FSK baseband signal.

50. The apparatus of claim 43 wherein said circuit further comprises a scaling unit that scales an error signal, said error signal indicative of a difference between said offset and a desired offset for said demodulated FSK baseband signal.

51. The apparatus of claim 43 wherein said circuit further comprises an accumulator that accumulates error signal values, each of said error signal values indicative of a difference between said offset and a desired offset for said demodulated FSK baseband signal.

52. The apparatus of claim 43 wherein said circuit further comprises an averaging circuit that averages said demodulated FSK baseband signal.

53. The apparatus of claim 43 wherein said circuit further comprises a first order feedback path to a frequency synthesizer, said frequency synthesizer including said sigma delta modulator and said phase locked loop circuit.

54. The apparatus of claim 43 wherein said circuit further comprises a second order feedback path to a frequency synthesizer, said frequency synthesizer including said sigma delta modulator and said phase lock locked loop circuit.

55. The apparatus of claim 43 wherein said baseband signal further comprises a BLUETOOTH baseband signal.

56. The apparatus of claim 43 wherein said baseband signal further comprises a HomeRF baseband signal.

57. The apparatus of claim 43 wherein said baseband signal further comprises an IEEE 802.11 baseband signal.

58. The apparatus of claim 43 wherein said baseband signal further comprises a DECT baseband signal.

59. The apparatus of claim 43 wherein said baseband signal further comprises a GSM baseband signal.

* * * * *

UNITED STATES PATENT AND TRADEMARK OFFICE
CERTIFICATE OF CORRECTION

PATENT NO. : 6,504,498 B1
DATED : January 7, 2003
INVENTOR(S) : O'Brien

It is certified that error appears in the above-identified patent and that said Letters Patent is hereby corrected as shown below:

Column 13,
Line 26, after "accumulated", insert -- by --.

Column 16,
Line 46, delete "51 land" and insert -- 511 and --.

Column 20,
Line 41, delete
"42. The method of claim 27 wherein said baseband signal is a GSM baseband signal".

Column 22,
Line 19, delete
"59. The apparatus of claim 43 wherein said baseband signal further comprises a GSM baseband signal".

Signed and Sealed this

Third Day of June, 2003

JAMES E. ROGAN
*Director of the United States Patent and Trademark Office*